June 13, 1967 A. P. KRUPER 3,325,706

POWER TRANSISTOR

Filed Oct. 1, 1964

WITNESSES

Theodore F. Wrobel

James F. Young

INVENTOR

Andrew P. Kruper

BY Gordon H Telfer

ATTORNEY

United States Patent Office 3,325,706

Patented June 13, 1967

3,325,706
POWER TRANSISTOR

Andrew P. Kruper, Penn Hills Township, Pittsburgh, Pa., assignor to Westinghouse Electric Corporation, Pittsburgh, Pa., a corporation of Pennsylvania Filed Oct. 1, 1964, Ser. No. 400,801
7 Claims. (Cl. 317—235)

This invention relates generally to semiconductor devices and, more particularly, to transistors capable of handling relatively large amounts of power.

A type of power transistor in current use is that having an interdigitated emitter-base contact configuration. In such devices, the emitter region is usually of a plurality of strips, no more than about two diffusion lengths wide, that are closely spaced to base contacts around all or a major portion of the emitter junction periphery.

One device of this type, for example, comprises a circular wafer of semiconductive material with a collector electrode fused to one of its major surfaces. On the other major surface are fused a circular alloy foil member and four annular rings concentric with the circular member to form what is sometimes referred to as the "five ring structure." Of the five rings, the circular member and the second and fourth annular rings are in ohmic contact with the semiconductive material while the first and third annular rings contain impurities to provide emitter regions of opposite semiconductivity type to that of the wafer. The ohmic contacts, serving as base contacts, are conventionally interconnected and have a lead attached thereto to provide the base lead of the device. The emitter electrodes are conventionally interconnected with a lead attached thereto to provide the emitter lead of the device.

It is a characteristic of devices as just described that they exhibit relatively high D.C. current gain at low collector current levels, such as below about 2 amperes, with the current gain falling off to lower values at higher current levels. A consequence of this is that the gain is not uniform over a very wide range of current values and hence the output of the device is distorted. Also, $I_{CEO}$, the collector to emitter leakage current with open base, is of appreciable magnitude, particularly at elevated temperatures, since it is the product of the collector-base diode leakage current, $I_{CBO}$, and the D.C. current gain.

It is, therefore, an object of the present invention to provide an improved transistor structure with more uniform current gain and reduced collector to emmitter leakage current with open base.

Another object is to provide an improved power transistor structure that in addition to being able to handle relatively large currents, exhibits a more linear, distortion-free output.

Another object is to provide an improved power transistor structure that provides an improvement in frequency response.

The present invention, in brief, achieves the abovementioned and additional objects and advantages by providing a unitary body of semiconductive material that may have the conventional five ring structure, for example, but with the emitter rings both conductively connected to the base ring that is intermediate them and with a lead attached thereto for the emitter lead. The remaining base contacts are interconnected with a lead attached thereto to serve as the base lead. This has been found to provide a path for returning the collector-base diode leakage current, $I_{CBO}$, to the emitter so that it is not amplified by transistor action. This modification also serves to markedly reduce the D.C. current gain over the low collector current region to provide a more uniform current gain characteristic.

The foregoing and additional objects and advantages of the present invention will be better understood by referring to the following discussion taken with the accompanying drawing, wherein.

Figure 1:
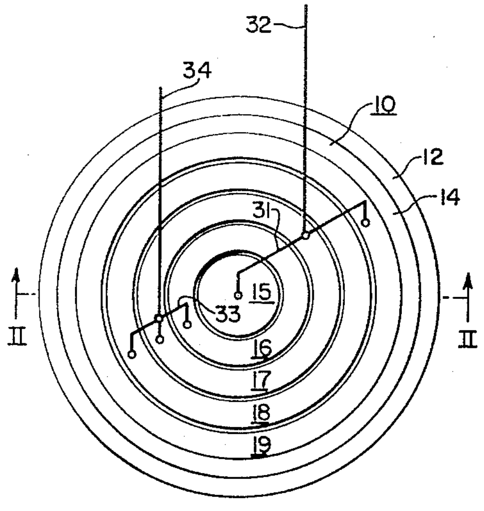
FIGURE 1 is a plan view of a device in accordance with the present invention.
Figure 2:
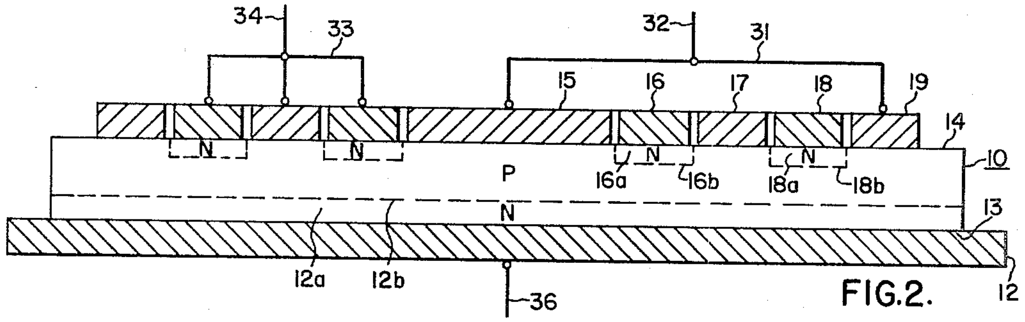
FIG. 2 is a sectional view, on an enlarged scale, of the device of FIGURE 1 taken along the line II—II.

Referring now to FIGS. 1 and 2, an illustrative embodiment of the present invention is shown that includes a monocrystalline silicon wafer 10 of a first type of semiconductivity. In this example the wafer is of P type semiconductivity. A collector electrode 12 is fused to a first major surface 13 of the wafer 10 and forms a region of recrystallized semiconductive material of N type semiconductivity **12*a* having a p-n junction interface 12*b* with the original material of the wafer 10**.

On the other major surface 14 of the wafer 10 is a circular central base electrode 15, a first ring-shaped emitter electrode 16, a first ring-shaped emitter electrode 17, a second ring-shaped emitter electrode 18 and a second ring-shaped base electrode 19. The base electrodes 15, 17 and 19 are fused in ohmic contact with the material of the wafer 10. The emitter electrodes 16 and 18 are fused to the wafer 10 and form recrystallized regions **16*a* and 18*a* of N type semiconductivity with p-n junction interfaces 16*b* and 18*b*, respectively, formed with the original material of the wafer 10**.

FIGS. 1 and 2 also illustrate the manner in which the electrodes of the device are interconnected. The central base electrode 15 is connected with the outermost base ring 19 by conductor 31 and an electrical lead 32 extends therefrom to serve as the base lead. The emitter electrodes 16 and 18 are interconnected with base electrode 17 by conductor 33 and an electric lead 34 extends therefrom to serve as the emitter lead. Another electrical lead 36, serving as the collector lead, extends from the collector electrode 12. The drawing merely shows a schematic illustration of the manner of interconnecting the electrodes and applying leads. Suitable means, including individual lead wires and conductive bridges, for this purpose will be apparent to those skilled in the art.

In use, the device illustrated in FIGS. 1 and 2 has the utility of a transistor amplifier. The base, emitter and collector leads 32, 34 and 36, respectively, are connected in a conventional operating circuit. A device in accordance with this invention provides distinct advantages over previous structures wherein the emitters of the device were separately interconnected and all the bases were separately interconnected.

Referring again to FIGS. 1 and 2, a more particular example of the practice of the present invention will be described. Devices were made as illustrated using a P type silicon wafer 10 having a (111) orientation, a 50 to 150 ohms centimeter resistivity and 200 microsecond carrier lifetime. The wafer was lapped to a thickness of 0.0043 inch and had a diameter of about 0.5 inch. The alloy foil members for the collector, emitter and base electrodes were of gold alloys having a thickness of about 0.0015 inch. Those for the base contacts included about 0.3 weight percent of boron with the balance gold and those with the collector and emitter electrodes were of about 0.6 weight percent of antimony and the remainder gold. The central base electrode 15 was circular and had a diameter of 0.110 inch. The first emitter electrode 16 had an inside diameter of 0.119 inch and an outside diameter of 0.188 inch. The first ring-shaped base electrode 17 had an inside diameter of 0.197 inch and an outside diameter of 0.276 inch. The second emitter electrode 18 had an inside diameter of 0.285 inch and an outside diameter of 0.363 inch. The second ring-shaped base electrode 19 had an inside diameter of 0.372 inch and an outside diameter of 0.449 inch.

The wafer 10 was positioned on top of the collector electrode 12 and the emitter and base electrodes were arranged in a concentric pattern as illustrated. The electrodes were fused to the silicon wafer by heating the sandwich above the gold-silicon eutectic temperature. The emitter rings 16 and 18 were connected to the intermediate base ring 17 by a gold-plated silver bridge 33 secured thereto by brazing. The central base electrode 15 and the outermost base electrode 19 were connected together by brazing a gold-plated silver bridge 31 thereto. Leads were attached to each of the bridges on the upper surface of the device and also to the collector electrode 12.

Figure 3:
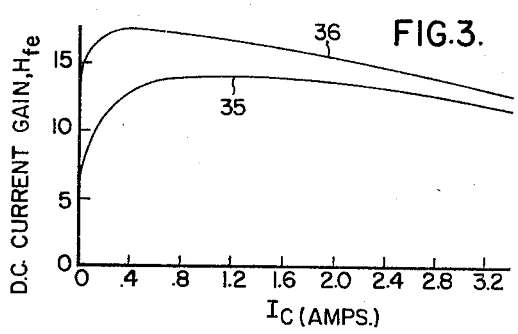
FIGS. 3 and 4 are graphs showing typical performance data achieved with a device as illustrated in FIGS. 1 and 2.

The current gain of a device as just described was measured for various values of collector current in an ambient that provided a calculated collector junction temperature of about 25° C. The results are illustrated in FIG. 3 where the D.C. current gain, $H_{fe}$, is plotted against the collector current $I_C$. The lowe rcurve 35 is of the results obtained with the device as just described. The upper curve 36 illustrates the corresponding data found for a device of the conventional type wherein the emitters and bases on the upper surface are each separately connected. As can be seen the device in accordance with this invention exhibits a much more uniform current gain. Particularly noticeable is that a low currents the current gain characteristic does not exhibit as sharp a peak as does the previous device.

Figure 4:
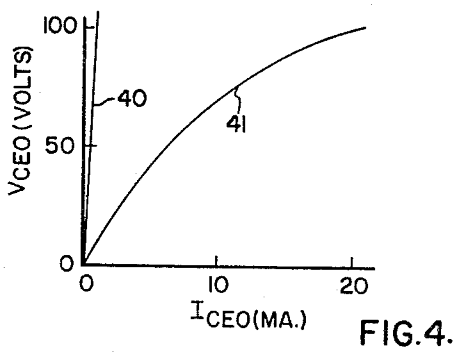

FIG. 4 presents data that further illustrates the advantages of the present invention. The open base collector-emitter leakage current, $I_{CEO}$, of a device as described above, was measured at various values of open base collector-emitter voltage, $V_{CEO}$, with the results as shown in the left-hand curve 40. The corresponding data for the prior art device is shown in the right-hand curve 41 illustrating that devices in accordance with this invention exhibit much less collector leakage current which makes the device more thermally stable and improves its frequency response. The data shown in FIG. 4 was obtained in an ambient with calculated collector junction temperature of approximately 60° C.

The aforesaid advantage of devices in accordance with this invention are achieved with some sacrifice in gain as is also shown in FIG. 3. However, for many purposes this can be tolerated and it is more desirable to secure uniform gain characteristic. It is also the case that some increase in saturation resistance occurs leading to somewhat increased heat dissipation but not too great for many applications.

It will be apparent that the devices in accordance with this invention may be variously fabricated using techniques other than the alloy fusion process described in connection with the previous illustrative embodiment. For example, diffusion and epitaxial growth techniques may be applied in the practice of this invention and, of course, other materials may be used both for the starting semiconductive material and also for impurities. Additionally, the semiconductivity type of the various regions may be reversed from that shown.

Figure 5:
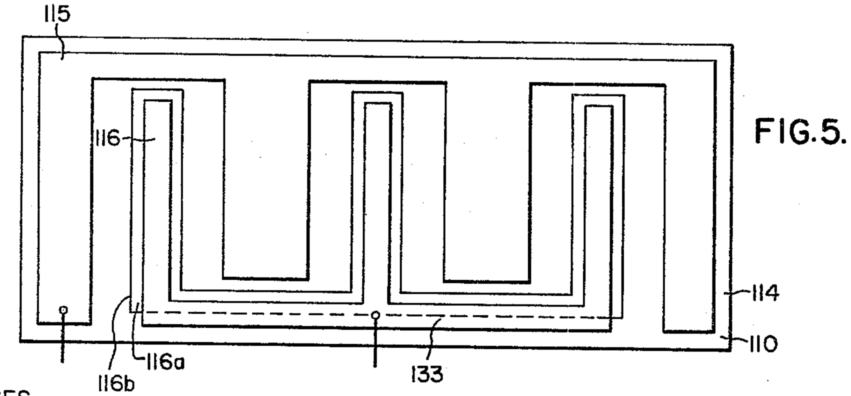
FIG. 5 is a plan view of an alternative embodiment of the present invention.

FIG. 5 illustrates an alternative configuration of the present invention. The device of FIG. 5 includes the essential feature of having a portion of the emitter-base junction shorted because it is this that provides the return path for the collector leakage current and accounts for the advantages of the present invention. The device of FIG. 5 comprises a semiconductive substrate 110 with a collector contact on the bottom surface, not shown. On the upper surface 114 is shown a diffused emitter region **116*a* of opposite semiconductivity type to that of the substrate 110 having a p–n junction interface 116*b* therewith. The emitter region 116*a* is in the form of segments interconnected along one edge of the device. Hence emitter 116*a* corresponds to both emitter regions 16*a* and 18*a* of FIG. 2 and junction 116*b* corresponds to both junctions 16*b* and 18*b* of FIG. 2. An emitter contact 116 is disposed on all the emitter segments and a portion 133 overlaps the junction 116*b* along the edge of the device. This provides the shorting action essential to the practice of the present invention. The contact 116 corresponds to both electrodes 16 and 18 of FIG. 2. The portion 133 of contact 116 that shorts part of the emitter junction corresponds to interconnection 33 of FIG. 2. The base contact 115, corresponding to base electrodes 15 and 19 of FIG. 2, is disposed around the emitter segments in a conventional interdigitated configuration. Base and emitter leads 132 and 134 are attached to contacts 115 and 116**, respectively. It will be appreciated that numerous other interdigitated emitter-base contact configurations may be adapted to the practice of the present invention.

While the present invention has been shown and described in a few forms only, it will be apparent that various changes and modifications may be made without departing from the spirit and scope thereof.

What is claimed is:

1. A power transistor comprising: a unitary body of semiconductive material of a first type of semiconductivity forming a base region; a plurality of regions of a second type of semiconductivity on said base region and forming p-n junctions therewith, said plurality of regions providing a collector region and a plurality of spaced emitter regions; a plurality of ohmic contacts on said base region providing a plurality of base contacts, said plurality of base contacts and said plurality of emitter regions being arranged on said body in alternating sequence so that each of said emitter regions is substantially enclosed by base contacts; first means to conductively interconnect a first of said base contacts to both first and second adjacent emitter regions and second means to conductively interconnect a second of said base contacts adjacent said first emitter region to a third of said base contacts adjacent said second emitter region to provide relatively uniform current gain over a wide range of current values.

2. A power transistor as in claim 1 wherein: a first electrical lead for use as an emitter lead is joined to said first means to conductively interconnect; a second electrical lead for use as a base lead is joined to said second means to conductively interconnect; and a third electrical lead for use as a collector lead is joined to said collector region.

3. A power transistor as in claim 1 wherein: said unitary body has first and second opposite major surfaces; said collector region substantially covers a first of said major surfaces; said plurality of emitter regions and said plurality of base contacts are arranged on said second major surface in a pattern of concentric circles.

4. A power transistor as in claim 3 wherein: said collector region and said plurality of emitter regions are of resrystallized semiconductive material with alloyed contacts fused thereto.

5. A transistor structure comprising: a base region; a collector region forming a first p-n junction with said base region; an emitter region having a configuration of a plurality of strips forming at least a second p-n junction with said base region; at least one ohmic base contact on said base region closely spaced from at least a major portion of said at least a second p-n junction, a base lead connected to said at least one ohmic base contact; an ohmic contact on each of said collector region and said emitter region and a lead member connected respectively to each; and conductive means interconnecting said plurality of strips of said emitter and extending between said emitter region ohmic contact and said base region.

6. A transistor structure in accordance with claim 5 wherein: said emitter region has a configuration of a plurality of discrete strips with each having an ohmic contact thereon and said conductive means comprises an additional ohmic contact on said base region and a lead to said additional base contact from each emitter contact.

7. A transistor structure in accordance with claim 5 wherein: said emitter region has a configuration of a plurality of joined strips with all of said strips having a common emitter ohmic contact thereon and said conductive means is an integral part of said common emitter ohmic contact disposed directly on a portion of said second p-n junction.

References Cited

UNITED STATES PATENTS

| | | | |
|---|---|---|---|
| 3,173,069 | 3/1965 | Stehney ------------ | 317—235 |
| 3,230,429 | 1/1966 | Stehney ------------ | 317—235 |
| 3,263,138 | 7/1966 | Nowalk ------------ | 317—235 |

JOHN W. HUCKERT, *Primary Examiner.*

D. J. GALVIN, D. O. KRAFT, A. M. LESNIAK, *Assistant Examiners.*